United States Patent [19]

Dietrich et al.

[11] 4,299,861
[45] Nov. 10, 1981

[54] PROCESS FOR THE PRODUCTION OF A FLEXIBLE SUPERCONDUCTOR

[75] Inventors: Manfred Dietrich, Bruchsal; Helmut Wühl, Karlsruhe; Erich Fitzer, Karlsruhe; Karl Brennfleck, Karlsruhe; Dietrich Kehr, Bibertal, all of Fed. Rep. of Germany

[73] Assignee: Kernforschungszentrum Karlsruhe Gesellschaft mit beschränkter Haftung, Karlsruhe, Fed. Rep. of Germany

[21] Appl. No.: 108,464

[22] Filed: Dec. 31, 1979

[30] Foreign Application Priority Data

Dec. 30, 1978 [DE] Fed. Rep. of Germany ....... 2856885

[51] Int. Cl.³ ............................................. B05D 5/12
[52] U.S. Cl. ................................... 427/62; 427/126.1; 427/249; 427/255.2; 427/255.4; 427/255.7; 427/376.6; 427/405; 427/419.1
[58] Field of Search ................... 427/62, 255.2, 255.4, 427/255.7, 249, 124, 123, 126.1, 304, 319, 320, 376.6, 380, 383.7, 405, 419.1

[56] References Cited

U.S. PATENT DOCUMENTS 3,328,200  6/1967  Neugebauer .......................... 427/62
3,400,016  9/1968  Enstrom et al. ...................... 427/62
3,985,281  10/1976  Diepers et al. ....................... 427/62

OTHER PUBLICATIONS

Pike et al., Applied Polymer Symposium, No. 129, 71–81 (1976) John Wiley & Sons.
Smith et al., Applied Polymer Symposium, No. 29, 83–92 (1976) John Wiley & Sons.

*Primary Examiner*—Michael R. Lusignan
*Assistant Examiner*—Richard Bueker
*Attorney, Agent, or Firm*—Spencer & Kaye

[57] ABSTRACT

A process for the production of a flexible superconductor comprising a carbon fiber having thereon a layer of niobium carbonitride, and an outer layer of a highly conductive metal. Initially, niobium is deposited on the fiber, and the niobium-coated fiber is then exposed to gaseous sources of carbon and nitrogen while the temperature is subsequently raised.

15 Claims, No Drawings

PROCESS FOR THE PRODUCTION OF A FLEXIBLE SUPERCONDUCTOR

BACKGROUND OF THE INVENTION

The present invention relates to a process for the production of a flexible superconductor comprising a carbon fiber with a thin layer of a niobium compound of the general formula $NbC_xN_y$ wherein the sum total of $x+y$ has a maximum value of 0.9 to 1.0, y has a value of 0.60 to 0.95, and x has a value of 0.05 to 0.40, and with an external, highly conductive metal layer, wherein the carbon fiber is treated with niobium chloride, carbon compounds, and nitrogen or nitrogen compounds in the gaseous phase.

Niobium carbonitride, $NbC_xN_y$, is a well known high-temperature superconductor. With proper selection of values for x and y, the transition temperature, i.e. the temperature below which the carbonitride becomes superconductive, may be in the range of 18° K.

Like other high-temperature superconductors, niobium carbonitride is brittle and thus can find only limited application in its solid form. This difficulty is avoided by producing a thin-layer of superconductor on a thin, flexible substrate.

There is, especially in the construction of large-scale superconducting magnets for hydrogen fusion, a requirement due to the occurring tensile stresses on the conductor that the conductor to be protected from a degradation of its superconducting properties.

To avoid these difficulties, it is known to deposit niobium carbonitride on carbon fibers by use of chemical vapor-phase deposition processes. To produce a niobium carbonitride coating on a substrate by chemical vapor-deposition (CVD), one would introduce, simultaneously, into a high-temperature furnace, a substrate, and a source, each, of niobium, nitrogen and carbon. Niobium pentachloride, $NbCl_5$, is usually the niobium source, while nitrogen may be supplied by $N_2$, $NH_3$, $(CH_3)_3N$, or $(CH_3)_2NH$, and carbon may be supplied by $CH_4$, or by one of the above mentioned amines $(CH_3)_3N$ or $(CH_3)_2NH$ which is also used as the nitrogen source. In another process when the substrate is a carbon filament, it is also possible to form the niobium carbonitride by reacting the carbon filament by simultaneous exposure of the carbon filament to $NbCl_5$, $H_2$ and $N_2$. The temperature at which these processes takes place is often about 1200° C., and can be in the range of 1400° C.

A particular property of a superconductor which determines its usefulness, is its critical current density, that is, the amount of current that it can carry without reverting to its normal-conducting state. Due to the high manufacturing temperature of the $NbC_xN_y$-coated carbon fibers produced by chemical vapor deposition, the coated fibers exhibit a structure which is unsuitable for high current carrying values. The problem of controlling the critical current density is discussed in G. E. Pike et al, Applied Polymer Symposium, No. 29, pp. 71-81 (1976), and in W. D. Smith et al, Applied Polymer Symposium, No. 29, pp. 83-92 (1976).

Absolute requirements for the achievement of high current-carrying values at high magnetic fields are sufficiently small grain sizes of the cubic niobium carbonitride, and/or a fine distribution of other phases such as hexagonal and tetragonal niobium carbonitride or voids, within the cubic carbonitride on the fiber. However, the single-stage manufacture by a simultaneous deposition of all components at high temperatures (around 1200° C.) promotes the formation of large grains with a low proportion of other phases.

Although the particle growth can be restricted by the use of additives such as $SiCl_4$ during the manufacturing process, as discussed in W. D. Smith et al, Op. cit., this is an additional burden on the manufacturing process, and negative effects can be expected on the superconducting transition temperature.

SUMMARY OF THE INVENTION

It is an object of the present invention to provide a process by which flexible superconductors having improved superconducting properties at high current-carrying values, can be produced from carbon fibers coated with niobium carbonitride.

It is another object of the present invention to limit particle growth in the niobium carbonitride layer at an early time, without the use of foreign additives, such as $SiCl_4$.

It is still another object of the present invention to produce superconductors with a superconductor transition temperature as high as or higher than that of superconductors manufactured according to conventional processes.

It is a further object of the present invention to produce a niobium carbonitride layer having a high non-metal-to-metal ratio.

To achieve these objects, and in view of its purposes, the present invention provides a process for the production of a flexible superconductor comprising a carbon fiber having thereon a thin layer of a compound of the formula $NbC_xN_y$ wherein x is 0.05 to 0.40, y is 0.60 to 0.95, and $x+y$ has a maximum value of 0.9 to 1.0, and further comprising an external, highly conductive metal layer, comprising the steps of:
  (a) depositing a niobium layer in a fine-grained structural configuration on the surface of a carbon fiber, at a temperature of 250° C. to 650° C.;
  (b) exposing the niobium-coated carbon fiber to carbon- and nitrogen-containing compounds under pressures higher than or equal to atmospheric pressure, and subsequently raising the temperature of the exposed fiber and the carbon and nitrogen containing compounds from the niobium deposition temperature used in step (a) to a minimum temperature of about 600° C. and a maximum temperature of about 1200° C., to allow carbon and nitrogen to diffuse into the niobium layer with the formation of niobium carbonitride; and
  (c) applying to the niobium carbonitride a layer of a highly conductive metal, by electroless coating.

It is to be understood that both the foregoing general description and the following detailed description are exemplary, but are not restrictive of the invention.

DETAILED DESCRIPTION OF THE INVENTION

The flexible substrate used in the process of the present invention is a carbon fiber. Typically, this carbon fiber is produced commercially by the high temperature carbonization of a rayon or polyacrylonitrile material yarn. The yarn produced by the carbonization process generally has 720 to 1000 carbon fibers, each of which is about 6–10 μm in diameter.

In the process of the present invention, niobium is deposited in a fine-grained structural configuration on the surface of the carbon fibers at temperatures in the range between 250° C. and 650° C., preferably in the range from 500° C. to 600° C. This can be accomplished by exposing the carbon fibers to gaseous niobium pentachloride, $NbCl_5$, at temperatures of 250° C. to 600° C., whereby nitrogen containing niobium layers are obtained by addition of some ammonia or amine to the $NbCl_5$ containing $H_2$ or $N_2$ carrier gas especially in the range of 250°–500° C. This further reduces the grain size of the niobium. The cubic carbonitride formation starts as before at the following (second stage) heat treatment under carbon and nitrogen containing reactive gases. Without any addition of ammonia or amine to the hydrogen carrier gas metallic niobium or a mixture of $NbCl_{3\pm x}$ and metallic niobium is obtained by hydrogen reduction of the $NbCl_5$ preferably at 400°–600° C. By addition of ammonia or amine to the $NbCl_5$-containing carrier gas, the formation of the nitrogen containing niobium takes place on the fiber and in the gaseous phase whereas by reduction of pure $NbCl_5$ by hydrogen the reduction mainly takes place on the fiber. The niobium layer can also be formed by the use of other niobium compounds, especially less stable ones, such as organometallic niobium compounds, for example, $NbCl_2(CH_3)_3$, etc.

The duration of the exposure of the fibers to the $NbCl_5$ can be, for example, from 1 to 10 minutes to produce a layer having a thickness of 0.1 to 1 $\mu$m. With addition of ammonia or amine during the niobium deposition, the growth rate of the mentioned example is reduced due to reactions in the gaseous phase.

After the niobium layer is deposited on the fibers, in a second reactor the fibers are exposed to gaseous sources of nitrogen and carbon, and the temperature is raised very gradually. The source of nitrogen and carbon can be those compounds typically used in the art for providing these elements. Examples of nitrogen sources are $NH_3$, $N_2H_4$ and amines of the formula $(CH_3)_3N$ and $(CH_3)_2NH$. Examples of carbon sources are $CH_4$, $C_2H_6$, $C_2H_4$, $C_2H_2$, $C_6H_6$ and the amines $(CH_3)_3N$, $(CH_3)NH_2$ and $(CH_3)_2NH$ which are also used as nitrogen sources. While $NH_3$ and $CH_4$ are preferred, the choice of compounds is not critical, so long as the compounds chosen serve as satisfactory sources of their respective elements.

The nitrogen and carbon sources used are exposed to the niobium-coated fibers at pressures greater than or equal to atmospheric (normal) pressure. Pressures of 1 atmosphere, for example, up to 100 atmospheres (or as high as technically performable) can be used. The temperature of the process is then raised slowly. Thereafter, as the temperature is gradually increased, nitrogen and carbon are formed by dissociation, and the nitrogen and carbon so formed spread along the grain boundaries through the entire niobium layer, and recrystallization is prevented during the beginning of the formation of the niobium carbonitride film.

If ammonia addition is used during niobium deposition, a deposition temperature range of 250°–500° C. is sufficient and the minimum temperature of the following heat treatment to form the cubic phase is over 600° C.

This is unexpected in view of the known phase diagrams of niobium carbonitride, which would require a minimum temperature of approximately 1050° C. An explanation may be the stabilization of the cubic phase due to defects of the lattice produced by the low temperature deposition and the influence of additions of nitrogen compounds during the niobium deposition. If the niobium deposition takes place without ammonia addition, a deposition temperature range of 400°–650° C. is required; then the minimum temperature of the following heat treatment is 900° C. Optimal transition temperature values are obtained at heat treatment temperatures $\geqq 1050°$ C. for niobium layers, if the carbonitride formation is confined completely to the diffusion process in the second stage to get a sufficient diffusion rate of the nitrogen and carbon atoms into the niobium layer.

The duration of the heat treatment, during which the temperature may be raised up to about 1200° C. can influence the superconducting properties of the product, in particular the transition point, and width of the transition range. Generally, longer heat treatments result in the onset of superconductivity at higher temperatures, but with a wider range of transition. The heat treatment can be, for example, for a period of 1 to 90 minutes for a film thickness of 0.5 $\mu$m.

The niobium carbonitride formed has the general formula $NbC_xN_y$, where x is 0.05 to 0.40, and y is 0.60 to 0.95. The sum of $x+y$ has a maximum value of 0.90 to 1.0.

Finally, the niobium carbonitride-coated fibers are coated with a layer of a highly conductive metal, for example, copper, by electroless coating, which is a well known technique which does not involve the use of electric current. One such method of deposition is the use of a copper cementation process as described by A. G. Kulkarni, B. C. Pai, N. Balasubramanian, J. of Materials Science Vol. 14 (1979), pp. 592–598. Also an infiltration process with a molten metal bath (such as aluminum) is possible. The critical current density achieved at zero field is about $1 \times 10^6$ A/cm$^2$. The grain size of niobium carbonitride is below 50 nm. The improvement of this semiconductor concept consists of the connection between the high superconducting potential of sputtered niobium carbonitride films with a suitable geometry (achieved by chemical vapor deposition), flexibility and tensile strength.

The following example is given by way of illustration to further explain the principles of the invention. These examples are merely illustrative and are not to be understood as limiting the scope and underlying principles of the invention in any way. All percentages referred to herein are by weight unless otherwise indicated.

EXAMPLE

Niobium pentachloride was vaporized at 125° C. and fed with a carrier stream of hydrogen gas of 10 l./h. into a reactor, where carbon fibers were provided. The deposition temperature was 600° C., and the deposition period was 17 minutes. In this way, a niobium layer having a thickness of 0.5 $\mu$m was obtained on the fibers.

Thereafter, in a second reactor, the niobium layer was converted into niobium carbonitride with a stream of $NH_3$ and $CH_4$ in a ratio of 1:3 and with a total throughput of 36 l./h. at gradually rising temperatures of up to 1100° C. The time of heat treatment exerted an important influence on the threshold value of the transition temperature and the transition range of the flexible superconductor produced in this way. With a 17-minute heat treatment, the onset of superconduction was at 17.9° K. and the transition range was 0.7° K. A 90-minute heat treatment caused the onset to occur at 18.2° K., with a transition range of 1.5° K. The mean grain diameter of the Nb carbonitride crystals in the coating was not changed by the differing heat treatment periods, but rather was smaller than 0.1 μm in both cases.

Finally, the superconductor was copper-plated in a copper bath without the use of electric current.

It will be understood that the above description of the present invention is susceptible to various modifications, changes and adaptations, and the same are intended to be comprehended within the meaning and range of equivalents of the appended claims.

What is claimed is:

1. A process for the production of a flexible superconductor comprising a carbon fiber having thereon a thin layer of a compound of the formula $NbC_xN_y$, wherein x is 0.05 to 0.40 and y is 0.60 to 0.90, and $x+y$ has a maximum value of 0.90 to 1.0, and further comprising an external highly conductive metal layer, comprising the steps of:
   (a) depositing a niobium layer in a fine-grained structural configuration on the surface of the carbon fiber, at a temperature of 250° C. to 650° C.;
   (b) exposing the niobium-coated carbon fiber to a gaseous carbon-containing compound and a gaseous nitrogen-containing compound under pressures higher than or equal to atmospheric pressure, and subsequently raising the temperature of the exposed fiber and the carbon-containing compound and the nitrogen-containing compound, from the niobium-deposition temperature used in step (a) to a minimum temperature of about 600° C. and a maximum temperature of about 1200° C., to allow carbon and nitrogen to diffuse into the niobium layer, with the formation of niobium carbonitride; and
   (c) applying to the niobium carbonitride layer, a layer of highly conductive metal, by electroless coating.

2. Process according to claim 1 wherein the temperature in step (b) is raised to a temperature of about 1050° C. to about 1200° C.

3. Process according to claim 1 wherein the deposition of niobium takes place in the presence of ammonia or amine at a temperature in the range of 250° C.–500° C.

4. Process according to claim 1 or 2 wherein the deposition of niobium takes place at 400° C. to 650° C.

5. Process according to claim 1 or 2 wherein niobium is deposited from niobium pentachloride supplied in a stream of hydrogen.

6. Process according to claim 1 or 2 wherein the highly conductive metal is copper or aluminum.

7. Process according to claim 6 wherein the copper is applied from a cementation process.

8. Process according to claim 1 or 2 wherein the carbon-containing compound is methane.

9. Process according to claim 1 or 2 wherein the nitrogen-containing compound is ammonia.

10. Process according to claim 3, wherein said subsequent raising of temperature is to about 600° C. in step (b).

11. Process according to claim 1 or 2, wherein said niobium layer is deposited without ammonia addition, and said subsequent raising of temperature is to a minimum of 900° C.

12. Process according to claim 1 or 2, wherein said subsequent raising of temperature in step (b) is for a period of 1 to 90 minutes.

13. Process according to claim 5, wherein said niobium layer is deposited for a period of 1 to 10 minutes to produce a layer having a thickness of 0.1 to 1 micron.

14. Process according to claim 1 or 2, wherein the carbon-containing compound and the nitrogen-containing compound are the same compound.

15. Process according to claim 14, wherein the same compound is $(CH_3)_3N$, $(CH_3)NH_2$ or $(CH_3)_2NH$.

* * * * *